US012769008B2

(12) United States Patent
We et al.

(10) Patent No.: US 12,769,008 B2
(45) Date of Patent: Oct. 20, 2026

(54) AVIATION BATHYMETRY LIDAR APPARATUS

(71) Applicants: Gwang Jae We, Seoul (KR); Hyunsoo Hur, Seoul (KR); Minyoung Kim, Seoul (KR); Kahyeon Kim, Seoul (KR)

(72) Inventors: Gwang Jae We, Seoul (KR); Hyunsoo Hur, Seoul (KR)

(73) Assignees: Gwang Jae We, Seoul (KR); Hyunsoo Hur, Seoul (KR); Minyoung Kim, Seoul (KR); Kahyeon Kim, Seoul (KR)

( * ) Notice: Subject to any disclaimer, the term of this patent is extended or adjusted under 35 U.S.C. 154(b) by 782 days.

(21) Appl. No.: 18/111,609

(22) Filed: Feb. 20, 2023

(65) Prior Publication Data

US 2024/0183991 A1 Jun. 6, 2024

Related U.S. Application Data

(60) Provisional application No. 63/430,043, filed on Dec. 4, 2022.

(51) Int. Cl.

| | |
|---|---|
| ***G01S 17/933*** | (2020.01) |
| ***G01S 7/481*** | (2006.01) |
| ***G01S 17/42*** | (2006.01) |
| ***H10F 30/225*** | (2025.01) |

(52) U.S. Cl.
CPC .......... *G01S 17/933* (2013.01); *G01S 7/4817* (2013.01); *G01S 17/42* (2013.01); *H10F 30/225* (2025.01)

(58) Field of Classification Search
USPC .......................................................... 356/5.01
See application file for complete search history.

(56) References Cited

U.S. PATENT DOCUMENTS

| | | | | |
|---|---|---|---|---|
| 2016/0327785 A1* | 11/2016 | Truscott | ................ | G01S 7/4817 |
| 2017/0184399 A1* | 6/2017 | Thayer | .................... | G01S 7/499 |
| 2021/0055418 A1* | 2/2021 | Hopper | .................. | B64U 20/87 |
| 2021/0293936 A1* | 9/2021 | Jeong | ...................... | G01S 17/89 |
| 2022/0057519 A1* | 2/2022 | Goldstein | ............... | G01S 17/88 |
| 2022/0099805 A1* | 3/2022 | Zhou | ..................... | G01S 17/931 |

OTHER PUBLICATIONS

Schwemmer et al.; "Holographic Optical Elements as Scanning Lidar Telescopes"; Optics and Lasers in Engineering, vol. 44, Issue 9, 2006 (Year: 2006).*

* cited by examiner

*Primary Examiner* — Yuqing Xiao
*Assistant Examiner* — Clint Thatcher
(74) *Attorney, Agent, or Firm* — Nicholas Park

(57) ABSTRACT

The aviation bathymetry LiDAR apparatus comprises: a first and a second laser generator; an optical manifold configured to couple a first and a second laser beam to generate a combine laser beam; a transfer mirror configured to reflect the combine laser beam in a direction parallel to a first axis; a prism configured to refract the combine laser beam at a first angle based on the first axis and to rotate based on the first axis; a holographic optical element configured to refract a return laser beam reflected from the target to emit the same to be parallel to the first axis, and to rotate with the prism; a telescope configured to condense the return laser beam received from the holographic optical element to generate a return combine laser beam, and to emit the return combine laser beam in a direction parallel to the first axis.

9 Claims, 7 Drawing Sheets

AVIATION BATHYMETRY LIDAR APPARATUS

CROSS-REFERENCE TO RELATED APPLICATION

This application claims priority to and the benefit of U.S. Patent Provisional Application No. 63/430,043, filed on Dec. 4, 2022, the disclosure of which is incorporated herein by reference in its entirety.

BACKGROUND

Technical Field

The present disclosure relates to a LiDAR apparatus, and more particularly, to an aviation bathymetry LiDAR apparatus.

Background Technology of the Invention

The LiDAR apparatus emits a laser beam to a target, and analyzes the laser beam reflected from the target. Specifically, the LiDAR apparatus is a device configured to measure a distance between the LiDAR apparatus and a target by analyzing a laser beam returning by the target. In addition, the LiDAR apparatus may further measure a direction, a speed, and the like of the laser beam.

The LiDAR apparatus is used for weather observation, distance measurement, etc. Recently, the LiDAR apparatus has been used in technologies for autonomous driving, weather observation using a satellite, an unmanned robot, and three-dimensional image modeling.

In addition, the LiDAR apparatus may be used for map building. In order to create a map including both the topography of the sea and the topography of the land, a step of acquiring the topography information of the sea using a LiDAR apparatus, a step of acquiring the topography information of the land using the LiDAR apparatus, and a step of integrating the topography information of the sea and the topography information of the land should be performed.

However, when each of the topographic information of the sea and the topographic information of the land is individually obtained, it takes a lot of time and effort to perform the step of integrating the topographic information of the sea and the topographic information of the land into one piece of topographic information.

SUMMARY

Technical Problem

One of the problems to be solved by the technical concept of the present disclosure is to provide an aviation bathymetry LiDAR apparatus capable of acquiring topographic information of a sea and topographic information of a land at a time.

Further, one of the problems to be solved by the technical concept of the present disclosure is to provide an aviation bathymetry LiDAR apparatus in which a range of sea depth measurement using a laser beam is widened.

Further, one of the problems to be solved by the technical concept of the present disclosure is to provide a small and light aviation bathymetry LiDAR apparatus.

Technical Solution

In order to achieve the object, as an exemplary embodiment of the disclosure, there is provided an aviation bathymetry LiDAR apparatus including: a first laser generator configured to generate a first laser beam; a second laser generator configured to generate a second laser beam having a wavelength different from that of the first laser beam; an optical manifold configured to receive and couple the first laser beam and the second laser beam to generate a combine laser beam; a transfer mirror configured to reflect the combine laser beam received from the optical manifold in a direction parallel to a first axis; a prism configured to refract the combine laser beam at a first angle based on the first axis to emit the combine laser beam to a target, and to rotate based on the first axis; a holographic optical element configured to refract a return laser beam reflected from the target to emit the return laser beam to be parallel to the first axis, and to integrally rotate with the prism; a telescope configured to condense the return laser beam received from the holographic optical element to generate a return combine laser beam, and to emit the return combine laser beam in a direction parallel to the first axis; and a detector configured to measure a distance to the target using at least one of an amount of light, an image of a wavelength, a speed, and an arrival time of the first laser beam and the second laser beam included in the return combine laser beam received from the telescope.

In an exemplary embodiment, a wavelength of the first laser beam may be in a range of about 1030 nm to about 1100 nm, and a wavelength of the second laser beam may be in a range of about 490 nm to about 570 nm.

In an exemplary embodiment, the first angle is characterized in that 15 degrees to 25 degrees.

In an exemplary embodiment, the aviation bathymetry LiDAR apparatus further comprises a scanner motor configured to rotate the prism and the holographic optical element about the first axis.

In an exemplary embodiment, the scanner motor includes: a shaft configured to accommodate the prism in an internal space and to rotate about the first axis; and a clamp configured to extend outward from the shaft and to fix the holographic optical element.

In an exemplary embodiment, the holographic optical element includes: a coupling region having a coupling hole coupled to the scanner motor; a first optical region provided in a ring shape to surround the coupling region and having a first optical pattern on a surface thereof to pass the first laser beam of the return laser beam; and a second optical region provided in a ring shape to surround the first optical region and having a second optical pattern on a surface thereof to pass the second laser beam of the return laser beam.

In an exemplary embodiment, the transfer mirror and the prism may be disposed to overlap the coupling hole of the holographic optical element in a first direction in which the first axis extends.

In the exemplary configuration, the footprint of the holographic optical element is characterized in that it is larger than the footprint of the prism.

In an exemplary embodiment, the combine laser beam reflected by the transfer mirror may be coaxial with the return combine laser beam emitted by the telescope.

In an exemplary embodiment, the detector may include: a photomultiplier tube configured to detect a wavelength corresponding to the second laser beam; and an avalanche photodetector configured to detect a wavelength corresponding to the first laser beam.

In an exemplary embodiment, the detector may further include: a splitter configured to distribute the second laser beam of the return combine laser beam received from the telescope to the photomultiplier; and a reflecting mirror configured to reflect the first laser beam received from the splitter to the avalanche photodetector.

DETAILED DESCRIPTION

Figure 1:
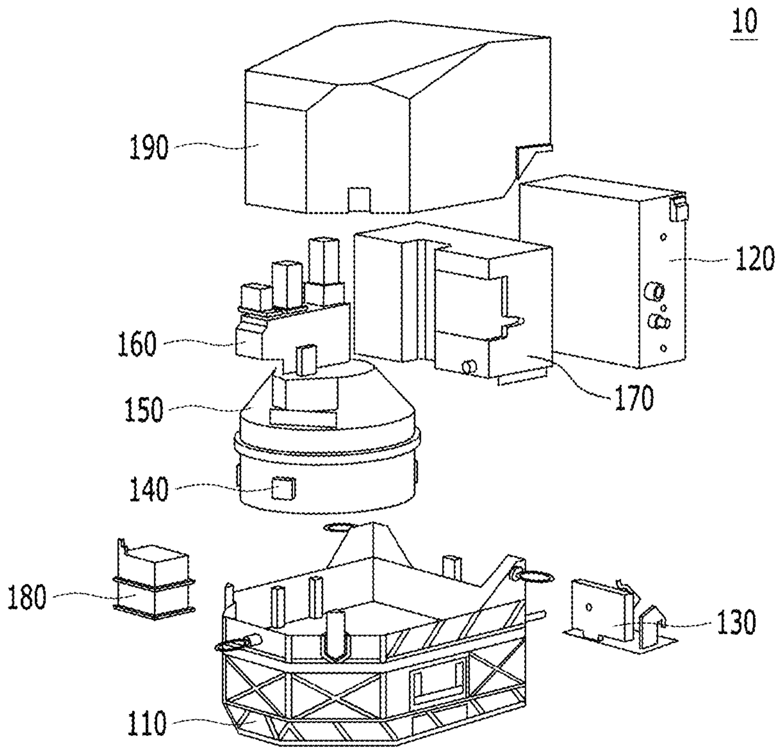
FIG. 1 is a view showing configurations of an aviation bathymetry LiDAR apparatus according to an exemplary embodiment of the present disclosure.

Hereinafter, exemplary embodiments of the present disclosure will be described in detail with reference to the accompanying drawings. Advantages and features of the present disclosure, and methods of achieving them will become apparent with reference to embodiments described in detail below together with the accompanying drawings. However, the technical spirit of the present disclosure is not limited to the following embodiments, but may be implemented in various different forms, and the following embodiments are provided to complete the technical spirit of the present disclosure and completely inform a person having ordinary skill in the art to which the present disclosure belongs of the scope of the present disclosure, and the technical spirit of the present disclosure is only defined by the scope of Claims.

In adding reference numerals to elements in each drawing, it should be noted that the same elements will be designated by the same reference numerals, if possible, even though they are shown in different drawings. In addition, in describing the present disclosure, when it is determined that a detailed description of related known configurations or functions may obscure the gist of the present disclosure, the detailed description thereof will be omitted.

Unless otherwise defined, all terms (including technical and scientific terms) used herein have the same meaning as commonly understood by one of ordinary skill in the art to which the present disclosure belongs. In addition, terms defined in commonly used dictionaries are not interpreted ideally or excessively unless they are clearly specifically defined. The terminology used herein is for the purpose of describing embodiments and is not intended to be limiting of the present disclosure. In the specification, a singular form includes a plural form unless specifically mentioned in the text.

In addition, in describing components of the present disclosure, terms such as first, second, A, B, (a), (b), and the like may be used. The term is used only to distinguish a component from another component, and the nature, sequence, or order of the corresponding component is not limited by the term. When it is described that a component is "connected", "coupled", or "linked" to another component, the component may be directly connected or connected to the other component, but it should be understood that another component may be "connected", "coupled", or "linked" between the components.

The terms "comprises" and/or "comprising" used in the present disclosure do not exclude the presence or addition of one or more other components, steps, operations, and/or elements mentioned.

Components included in any one embodiment and components including common functions may be described using the same names in other embodiments. Unless stated otherwise, the description described in any one embodiment may be applied to other embodiments, and the detailed description may be omitted within a redundant range or a range that can be obviously understood by a person having ordinary skill in the art. Hereinafter, the present invention will be described in detail with reference to preferred embodiments of the present invention and the accompanying drawings.

FIG. 1 is a view showing configurations of an aviation bathymetry LiDAR apparatus 10 according to an embodiment of the present invention. Further, FIG. 2 is a view showing an optical system of the aviation bathymetry LiDAR apparatus 10 according to an exemplary embodiment of the present disclosure.

The aviation bathymetry LiDAR apparatus 10 according to an exemplary embodiment of the present disclosure may be a device installed in an aircraft and configured to measure the depth and topography of the sea. Specifically, the aviation bathymetry LiDAR apparatus 10 may be an apparatus configured to emit a combine laser beam Lc in which a plurality of laser beams are coupled toward the sea, and receive a return laser beams reflected from the surface and the bottom of the sea to measure the depth and topography of the sea.

In addition, the aviation bathymetry LiDAR apparatus 10 according to an exemplary embodiment of the present disclosure may be an apparatus installed in an aircraft and configured to measure all of the topography of the land, the depth and the topography of the sea. Specifically, while the aviation bathymetry LiDAR apparatus 10 is moving in the air through an aircraft, the aviation bathymetry LiDAR apparatus 10 may emit a combine laser beam Lc in which a plurality of laser beams are coupled toward the sea and the land. Also, the aviation bathymetry LiDAR apparatus 10 may be an apparatus configured to receive the return laser beams reflected from the ground surface, the surface of the sea, and the bottom of the sea and simultaneously measure the topography of the land, the depth of the sea, and the topography of the sea.

Figure 2:
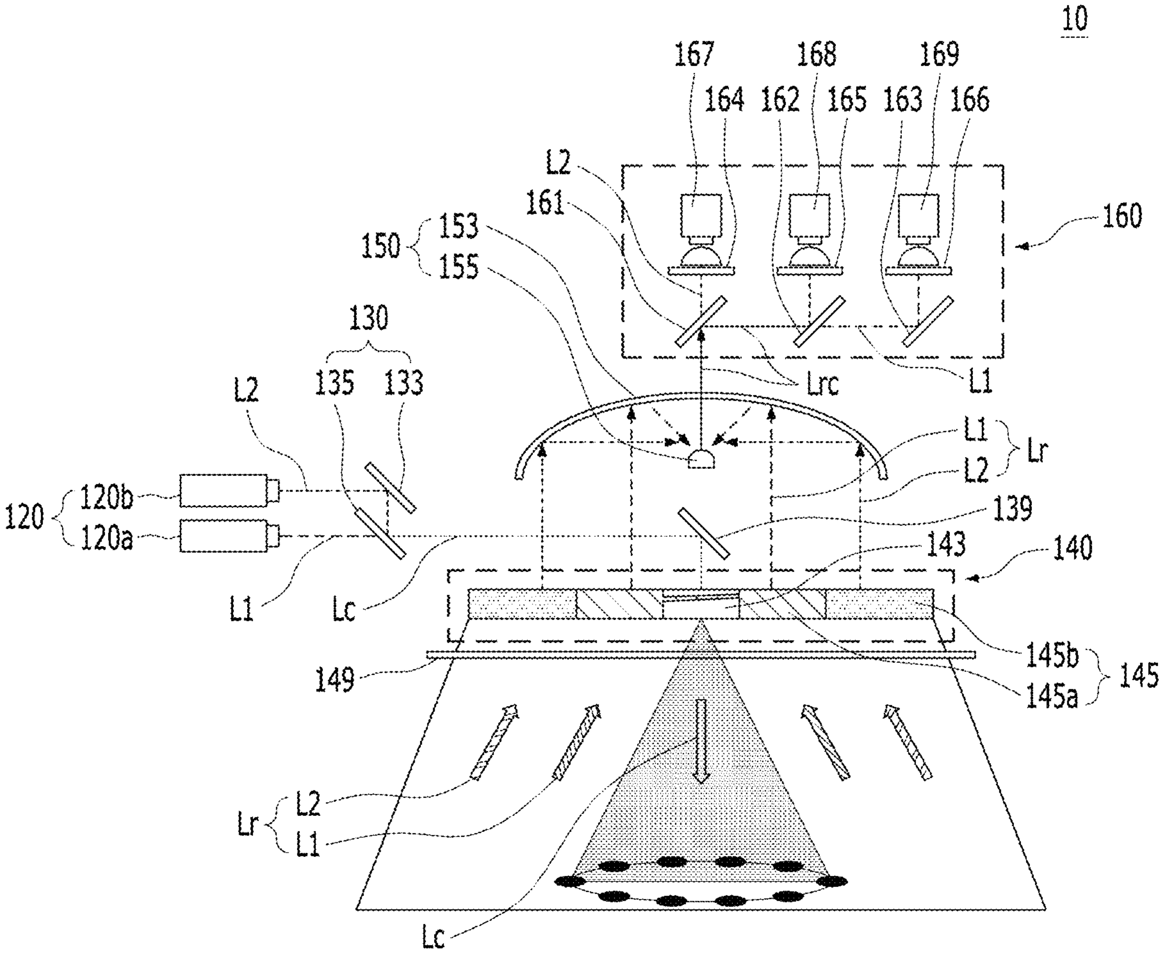
FIG. 2 is a view showing an optical system of an aviation bathymetry LiDAR apparatus according to an exemplary embodiment of the present disclosure.

Referring to FIGS. 1 and 2, the aviation bathymetry LiDAR apparatus 10 according to an exemplary embodiment of the present disclosure may include a housing 110, a laser generator 120, an optical manifold 130, a transfer mirror 139, a scanner 140, a telescope 150, a detector 160, a Line-Replacement Unit (LRU) 170, an Inertial measurement sensor 180, a cover 190, and the like.

The housing 110 may provide a space for accommodating components of the aviation bathymetry LiDAR apparatus 10. For example, the laser generator 120, the optical manifold 130, the scanner 140, the telescope 150, the detector 160, the LRU 170, and the inertial measurement sensor 180 may be accommodated in a space provided by the housing 110.

In an exemplary embodiment, the housing 110 may have a hole or a window in a lower surface thereof. Specifically, the housing 110 may have a hole or a window for emitting a laser beam toward the sea and the land and receiving a laser beam reflected from the surface of the sea, the bottom surface of the sea, and the ground surface.

The laser generator 120 may be configured to generate a laser beam having a predetermined wavelength. The laser generator 120 may include a first laser generator 120*a* and a second laser generator 120*b*.

The first laser generator 120*a* may be configured to generate a first laser beam L1 having a first wavelength. In an exemplary embodiment, the first laser generator 120*a* may be configured to generate a first laser beam L1 having a wavelength of an infrared ray.

In an exemplary embodiment, the first wavelength of the first laser beam L1 may be about 1030 nm to about 1100 nm. For example, the first wavelength of the first laser beam L1 may be 1064 nm. The first laser beam L1 having the first wavelength may be a laser beam reflected from the ground surface. In addition, the first laser beam L1 having the first wavelength may be a laser beam that does not pass through the surface of the sea and is reflected from the surface of the sea.

That is, the first laser generator 120*a* may generate the first laser beam L1 for obtaining the topographical information of the land and the surface information of the sea. However, the first wavelength of the first laser beam L1 is not limited to 1064 nm, and may have various wavelengths such as 905 nm, 1550 nm, and the like.

The second laser generator 120*b* may be configured to generate a second laser beam L2 having a second wavelength different from the first wavelength. In an exemplary embodiment, the second laser generator 120*b* may be configured to generate a second laser beam L2 having a wavelength of a visible ray. Specifically, the second laser generator 120*b* may be configured to generate a second laser beam L2 having a wavelength of a green visible ray.

In an exemplary embodiment, the second wavelength of the second laser beam L2 may be about 490 nm to about 570 nm. For example, the second wavelength of the second laser beam L2 may be 532 nm. The second laser beam L2 having the second wavelength may be a laser beam that passes through the surface of the sea and reaches the bottom of the sea. That is, the second laser generator 120*b* may generate the second laser beam L2 for obtaining the depth of the sea and the topographic information of the bottom surface of the sea. However, the second wavelength of the second laser beam L2 is not limited to 532 nm.

Since the laser generator 120 of the present disclosure may include the first laser generator 120*a* that emits the first laser beam L1 having the first wavelength and the second laser generator 120*b* that emits the second laser beam L2 having the second wavelength, the laser generator 120 may obtain both the topography information of the sea and the topography information of the land by using the first laser beam L1 and the second laser beam L2.

In an exemplary embodiment, the first laser generator 120*a* and the second laser generator 120*b* may emit the first laser beam L1 and the second laser beam L2 such that the first laser beam L1 and the second laser beam L2 are emitted with a time difference therebetween. However, the present invention is not limited thereto, so that the first laser beam L1 and the second laser beam L2 are emitted simultaneously, the first laser generator 120*a* and the second laser generator 120*b* may emit the first laser beam L1 and the second laser beam L2.

The optical manifold 130 may be configured to generate a combine laser beam Lc by coupling the first laser beam L1 and the second laser beam L2 received from the first laser generator 120*a* and the second laser generator 120*b*. In addition, the optical manifold 130 may be configured to transfer the combine laser beam Lc to the transfer mirror 139.

The optical manifold 130 may include a first reflecting mirror 133 and a beam combiner 135. The first reflecting mirror 133 may be a mirror configured to reflect the second laser beam L2 output from the second laser generator 120*b* toward the beam combiner 135.

In addition, the beam combiner 135 may generate a combine laser beam Lc by coupling the first laser beam L1 and the second laser beam L2. In detail, the beam combiner 135 may generate the combine laser beam Lc by coupling the first laser beam L1 received from the first laser device 120*a* and the second laser beam L2 received from the first reflecting mirror 133.

In an exemplary embodiment, the beam combiner 135 may couple the first laser beam L1 and the second laser beam L2 having different pulse widths to generate a channel that is transmitted and received coaxially. In addition, the beam combiner 135 may act as a lens with respect to the first laser beam L1 and may act as a mirror with respect to the second laser beam L2.

The transfer mirror 139 may reflect the combine laser beam Lc received from the optical manifold 130 in a predetermined direction. For example, the transfer mirror 139 may be a mirror configured to reflect the combine laser beam Lc.

In an exemplary embodiment, the transfer mirror 139 may reflect the combine laser beam Lc such that the combine laser beam Lc received from the beam combiner 135 reaches the prism 143.

In an exemplary embodiment, the transfer mirror 139 may reflect the combine laser beam Lc such that the path of the combine laser beam Lc faces the first direction. The first direction may be a direction substantially parallel to the direction of gravity. For example, the transfer mirror 139 may refract the direction of the combine laser beam Lc by about 90 degrees.

In other words, the transfer mirror 139 may reflect the combine laser beam Lc such that the combine laser beam Lc faces a direction parallel to the direction of gravity. For example, the transfer mirror 139 may receive the combine laser beam Lc traveling in a direction parallel to the direction of the earth's surface, and then may reflect the combine laser beam Lc in a direction parallel to the direction of gravity.

The scanner 140 may refract the combine laser beam Lc received from the transfer mirror 139 at a first angle with respect to a first axis extending in the first direction. In addition, the scanner 140 may be configured to rotate about the first axis such that the refracted combine laser beam Lc is emitted toward the target in a rotating state.

The return laser beam Lr reflected from the target may reach the scanner 140 in the state of being refracted at the first angle. The scanner 140 may be configured to refract the return laser beam Lr at the first angle such that the return laser beam Lr reflected from the target and received is parallel to the first axis.

In an exemplary embodiment, the scanner 140 may include a prism 143, a Holographic optical element (HOE) 145, a scanner motor (FIG. 5, 147), and the like.

The prism 143 may be configured to refract the combine laser beam Lc received from the transfer mirror 139 at a first angle with respect to a first axis. Specifically, the prism 143 may be configured to refract the combine laser beam Lc received from the transfer mirror 139 at a first angle with respect to a first axis extending in the direction of gravity. The prism may be an optical glass configured to refract the combine laser beam Lc.

As will be described later, the prism 143 may be disposed to be surrounded by the holographic optical element 145. That is, the prism 143 may be disposed at a central portion of the scanner 140, and the holographic optical element 145 may be disposed at an edge portion of the scanner 140. For example, the prism 143 may be an achromatic prism generated by combining two prisms having an apex angle to reduce dispersion of the laser beam.

In an exemplary embodiment, the prism 143 may be configured to refract the combine laser beam Lc received from the transfer mirror 139 at a first angle with respect to a first axis. The first angle may be in a range of about 15 degrees to about 25 degrees.

When the first angle is less than 15 degrees, a bathymetry range by the combine laser beam Lc passing through the prism 143 of the present disclosure may be narrowed. That is, as the bathymetry range is narrowed, the time for bathymetry by the aviation bathymetry LiDAR apparatus 10 of the present disclosure may be increased, and the efficiency of aviation bathymetry may be reduced.

Further, if the second angle is greater than 25 degrees, the return laser beam Lr reflected from the target (e.g., the surface and bottom surface of the sea) may not reach the holographic optical element 145 of the scanner 140. That is, as the reception amount of the return laser beam Lr by the holographic optical element 145 of the scanner 140 decreases, the bathymetry efficiency by the aviation bathymetry LiDAR apparatus 10 of the present disclosure may decrease.

In an exemplary embodiment, the prism 143 may be configured to rotate about a first axis extending in a first direction parallel to the direction of gravity. Specifically, the prism 143 may rotate about the first axis by an operation of the scanner motor 147. Accordingly, the prism 143 may emit the combine laser beam Lc in a rotating state.

The combine laser beam Lc refracted at a first angle with respect to the first axis by the prism 143 may reach the sea and the land in a rotating state. That is, while the aviation bathymetry LiDAR apparatus 10 of the present disclosure moves in the horizontal direction in the air, the aviation bathymetry LiDAR apparatus 10 may emit the combine laser beam Lc which is refracted at the first angle by the prism 143 into the sea and the land.

Accordingly, when the combined laser beam Lc emitted toward the sea and the land by the aviation bathymetry LiDAR apparatus 10 is viewed from a planar perspective, the combine laser beam Lc may be provided in a ring shape. In addition, when the combined laser beam Lc emitted toward the sea and the land by the aviation bathymetry LiDAR apparatus 10 is viewed from a three-dimensional perspective, the combine laser beam Lc may be provided in a conical shape.

In an exemplary embodiment, the aviation bathymetry LiDAR apparatus 10 of the present disclosure may further include a window 149. The window 149 may pass the combine laser beam Lc passing through the prism 143. In addition, the window 149 may pass the return laser beam Lr reflected from the sea and the land. In addition, the window 149 may be disposed below the scanner 140. Specifically, the window 149 may be disposed below the prism 143 and the holographic optical element 145.

The holographic optical element 145 may refract the return laser beam Lr reflected from the target and emit the return laser beam Lr in a direction parallel to the first axis.

In detail, the holographic optical element 145 may refract the return laser beam Lr at a first angle with respect to the first axis such that the traveling direction of the return laser beam Lr is parallel to the first direction.

The combine laser beam Lc passing through the prism 143 may reach the target in a state of being refracted at a first angle with respect to the first axis. Specifically, a portion of the combine laser beam Lc may be reflected from the target. Also, a laser beam reflected from the target and reaching the holographic optical element 145 may be defined as a return laser beam Lr.

The holographic optical element 145 may refract the return laser beam Lr such that the return laser beam Lr is emitted in a direction parallel to the first axis. In detail, the holographic optical element 145 may refract the return laser beam Lr at a first angle with respect to a first axis such that a traveling direction of the return laser beam Lr is parallel to a first direction (e.g., a gravity direction).

The holographic optical element 145 may be an optical element configured to restrictively pass a laser beam of a specific wavelength region and refract the laser beam at a predetermined angle. For example, the holographic optical element 145 may include a lens configured to refract the laser beam. In addition, the material of the holographic optical element 145 may include glass.

In an exemplary embodiment, the holographic optical element 145 may be disposed at an edge portion of the scanner 140. In detail, the holographic optical element 145 may be disposed to surround a side portion of the prism 143. For example, when the scanner 140 is viewed from a plan view, the holographic optical element 145 may be provided in a ring shape to surround a side of the prism 143.

Also, when the scanner 140 is viewed from a plan view, a footprint of the holographic optical element 145 may be greater than a footprint of the prism 143. The footprint may be defined as the area occupied by the component when the component is viewed from a plan view. In other words, when the scanner 140 is viewed from a plan view (that is, when the scanner 140 is viewed from a plane perpendicular to the first axis), the area of the holographic optical element 145 may be larger than the area of the prism 143.

In a method of obtaining terrain information of a sea and terrain information of a land by using the aviation bathymetry LiDAR apparatus 10 of the present disclosure, it may be important to improve a reception amount of a return laser beam reflected from the sea and the land. In addition, the laser beam that is refracted at the first angle through the prism 143 and is emitted to the sea and the land tends to be reflected from the sea and the land and return to an adjacent region of the prism 143. Accordingly, in order to improve the reception amount of the return laser beam reflected from the sea and the land, the holographic optical element 145 needs to be disposed in a region adjacent to the prism 145 and have a relatively large footprint.

Accordingly, the holographic optical element 145 of the present disclosure may be provided in a ring shape surrounding the prism 143. Also, the holographic optical element 145 and the prism 143 may be disposed at substantially the same level. And the footprint of the holographic optical element 145 may be larger than the footprint of the prism 143.

In an exemplary embodiment, the holographic optical element 145 may include a first optical region **145*a* configured to pass the first laser beam L1 of the return laser beam Lr, and a second optical region 145*b* configured to pass the second laser beam L2** of the return laser beam Lr.

The first optical region **145*a* may be disposed at a central portion of the holographic optical element 145 and may pass the first laser beam L1 having the first wavelength therethrough. In addition, the first optical region 145***a* may refract the first laser beam L1 at a first angle with respect to the first axis such that the traveling direction of the first laser beam L1 is parallel to the first axis. In addition, the first optical region 145*a* may be provided in a ring shape to surround the prism 143.

The second optical region 145*b* may be disposed at an edge portion of the holographic optical element 145 to surround the first optical region 145*a* and may pass the second laser beam L2 having the second wavelength. In addition, the second optical region 145*b* may refract the second laser beam L2 at a first angle with respect to the first axis such that the traveling direction of the second laser beam L2 is parallel to the first axis. In addition, the second optical region 145*b* may be provided in a ring shape to surround the first optical region 145*a*.

The technical idea of the holographic optical element 145 will be described in more detail with reference to FIGS. 5 and 6.

The scanner motor 147 may be configured to rotate the prism 143 and the holographic optical element 145. For example, the scanner motor 147 may be provided as a hollow motor. Accordingly, the prism 143 and the holographic optical element 145 may rotate in the same direction while having substantially the same angular velocity.

Since the scanner motor 147 may rotate the prism 143, the combine laser beam Lc refracted at the first angle by passing through the prism 143 may reach the target in a rotating state.

In addition, since the first optical region 145*a* and the second optical region 145*b* of the holographic optical element 145 may be provided in a ring shape, the first optical region 145*a* and the second optical region 145*b* may maintain the ring shape even while the scanner motor 147 rotates the holographic optical element 145.

The technical idea of the scanner motor 147 will be described in more detail with reference to FIG. 5.

The telescope 150 may be configured to condense the return laser beam Lr received from the holographic optical element 145 to generate a return combine laser beam Lrc, and to emit the return combine laser beam Lrc in a direction parallel to the first axis.

Specifically, the telescope 150 may be configured to generate a return combine laser beam Lrc by coupling the return laser beam Lr received from the scanner 140, and to emit the return combine laser beam Lrc in a predetermined direction (e.g., a first direction).

In an exemplary embodiment, the telescope 150 may be configured to emit the return combine laser beam Lrc to the detector 160. In an exemplary embodiment, the telescope 150 may include a plurality of second and third reflecting mirrors 153 and 155 that condense the return laser beam Lr received from the scanner 140 to generate the return-combine laser beam Lrc and emit the return combine laser beam Lrc into the detector 160.

In an exemplary embodiment, the second reflecting mirror 153 may reflect the return laser beam Lr including the first laser beam L1 and the second laser beam L2 to the third reflecting mirror 155.

Specifically, the second reflecting mirror 153 may reflect the first laser beam so that the first laser beam L1 having passed through the first optical region 145*a* reaches the third reflecting mirror 155. In addition, the second reflecting mirror 153 may reflect the second laser beam so that the second laser beam L2 passing through the second optical region 145*b* reaches the third reflecting mirror 155.

In an exemplary embodiment, the second reflecting mirror 153 may be an aspherical mirror. Specifically, the second reflecting mirror 153 may be a mirror whose surface is polished to an aspherical surface. For example, the second reflecting mirror 153 may include any one of an elliptical mirror and a hyperbolic mirror. However, the present invention is not limited thereto, and the second reflecting mirror 153 may be a Fresnel mirror.

The third reflecting mirror 155 may generate the return combine laser beam Lrc by coupling the first laser beam L1 and the second laser beam L2 received from the second reflecting mirror 134, and may reflect the return combine laser beam Lrc to a predetermined region. In an exemplary embodiment, the third reflecting mirror 155 may reflect the laser beam Lrc, which is the return combine, to the detector 160.

In detail, the third reflecting mirror 155 may generate the return combine laser beam Lrc by coupling the first laser beam L1 and the second laser beam L2 received from the second reflecting mirror 134, and may reflect the return combine laser beam Lrc to the detector 160.

In an exemplary embodiment, the return combine laser beam Lrc reflected by the telescope 150 may be coaxial with the combine laser beam Lc reflected by the transfer mirror 139. That is, both the return combine laser beam Lrc reflected by the telescope 150 and the combine laser beam Lc reflected by the transfer mirror 139 may be on the first axis. Accordingly, the efficiency of bathymetry using the aviation bathymetry LiDAR apparatus 10 of the present disclosure may be improved.

The detector 160 may be configured to measure a distance to the target by using at least one of a light amount, an image of a wavelength, a speed, and an arrival time of the first laser beam L1 and the second laser beam L2 included in the laser beam Lrc that is the return combine received from the telescope 150.

In detail, the detector 160 may obtain the topographical information of the surface of the sea and the topographical information of the land by using at least one of the light amount, the image of the wavelength, the speed, and the arrival time of the first laser beam L1 received from the telescope 150

In addition, the detector 160 may obtain the topography information of the bottom surface of the sea using at least one of the light amount the image of the wavelength, the speed, and the arrival time of the second laser beam L2 received from the telescope 150.

The detector 160 may include a first splitter 161, a second splitter 162, a fourth reflecting mirror 163, a first filter 164, a second filter 165, a third filter 166, a first photomultiplier tube 167, a second photomultiplier tube 168, and an avalanche photodetector 169.

The first splitter 161 and the second splitter 162 may distribute the second laser beam L2 of the return combine laser beam Lrc to the first photomultiplier tube 167 and the second photomultiplier tube 168. In an exemplary embodiment, the first splitter 161 may distribute a portion of the return combine laser beam Lrc to the first photomultiplier tube 167. In addition, the second splitter 162 may distribute a portion of the return combine laser beam Lrc received from the first splitter 161 to the second photomultiplier tube 168.

In addition, the fourth reflecting mirror 163 may distribute the first laser beam L1 of the return combine laser beam Lrc from the second splitter 162 to the avalanche photodetector 169.

The first photomultiplier tube 167 may be configured to detect a wavelength corresponding to the second laser beam L2 included in the return combine laser beam Lrc distributed from the first splitter 161. In addition, the first photomultiplier tube 167 may be a photomultiplier tube that receives the second laser beam L2 reflected from the seabed of the sea having a relatively deep water depth.

The second wavelength may be a wavelength passing through the surface of the sea. Specifically, the second wavelength may be about 490 nm to about 570 nm. For example, the second wavelength may be 532 nm.

The second photomultiplier tube 168 may be configured to detect a wavelength corresponding to the second laser beam L2 included in the return combine laser beam Lrc distributed from the second splitter 162. In addition, the second photomultiplier tube 168 may be a photomultiplier tube that receives the second laser beam L2 reflected from the seabed of the sea having a relatively shallow water depth.

The second wavelength may be a wavelength passing through the surface of the sea. Specifically, the second wavelength may be about 490 nm to about 570 nm. For example, the second wavelength may be 532 nm.

The Avalanche Photodetector (APD) 242 may be configured to detect a first wavelength corresponding to the first laser beam L1 included in the return combine laser beam Lrc reflected from the fourth reflecting mirror 163.

The first wavelength may be a wavelength that does not pass through the surface of the sea. In other words, the first wavelength may be the wavelength of the laser beam reflected from the surface of the sea and the surface of the land. Specifically, the first wavelength may be about 1030 nm to about 1100 nm. For example, the first wavelength may be 1064 nm.

The first filter 164 may be disposed between the first photomultiplier tube 167 and the first splitter 161. The first filter 164 may perform filtering so that only the second laser beam L2 having the second wavelength among the return combine laser beam Lrc distributed from the first splitter 161 pass through the first filter 164. For example, the first filter 164 may pass only a laser beam having a wavelength of 532 nm. In addition, the first filter 164 may be a filter configured to reduce the light intensity of the second laser beam L2.

The second filter 165 may be disposed between the second photomultiplier tube 168 and the second splitter 162. The second filter 165 may perform filtering so that only the second laser beam L2 having the second wavelength among the return combine laser beam Lrc distributed from the second splitter 162 pass through the second filter 165. For example, the second filter 165 may pass only a laser beam having a wavelength of 532 nm. In addition, the second filter 165 may be a filter configured to reduce the light intensity of the second laser beam L2.

The third filter 166 may be disposed between the avalanche photodetector 169 and the fourth reflecting mirror 163. The third filter 166 may perform filtering so that only the first laser beam L1 having the first wavelength among the return combine laser beam Lrc reflected from the fourth reflecting mirror 163 pass through the third filter 166. For example, the third filter 166 may pass only a laser beam having a wavelength of 1064 nm. In addition, the third filter 166 may be a filter configured to reduce the light intensity of the first laser beam L1.

The Line-Replacement Unit (LRU) 170 may be configured to control at least one of the laser generator 120, the optical manifold 130, the transfer mirror 139, the scanner 140, the telescope 150, the detector 160, and the inertial measurement sensor 180. For example, the LRU 170 may be a controller including an electrical control board. Specifically, the LRU 170 may be configured to supply power to or control the components of the aviation bathymetry LiDAR apparatus 10. In addition, the LRU 170 may be provided as a Line-replaceable device for ease and speed of replacement.

The inertial measurement sensor 180 may be a sensor configured to measure the inertia of the aircraft. Specifically, the inertial measurement sensor 180 may be a sensor configured to measure posture information such as a velocity, acceleration, a position, or the like of the aircraft.

The terrain information detected by the detector 160 may be corrected based on the attitude information of the aircraft obtained from the inertial measurement sensor 180. Accordingly, bathymetry using the aviation bathymetry LiDAR apparatus 10 of the present disclosure may be accurately performed.

Figure 3:
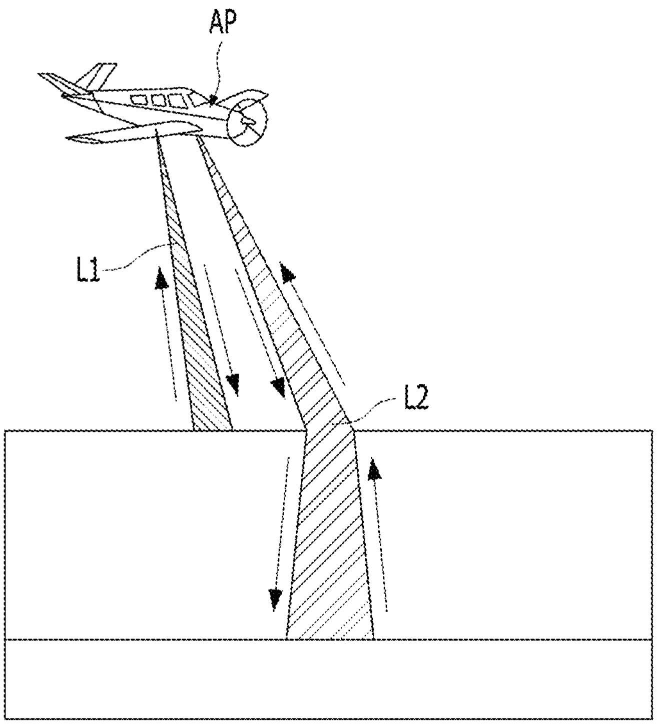
FIG. 3 and FIG. 4 are views illustrating a method of measuring a depth of water using an aviation bathymetry LiDAR apparatus according to an exemplary embodiment of the present disclosure.
Figure 4:
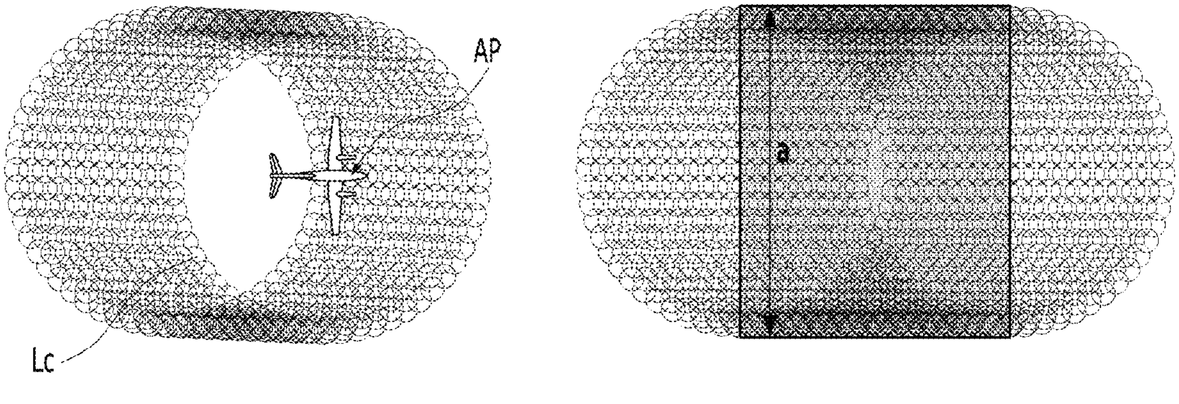

FIG. 3 and FIG. 4 are views illustrating a method of bathymetry using the aviation bathymetry LiDAR apparatus 10 according to an exemplary embodiment of the present disclosure.

Referring to FIGS. 3 and 4 together, the aviation bathymetry LiDAR apparatus 10 of the present disclosure is mounted on an aircraft AP and may be used while moving based on the horizontal movement of the aircraft AP.

The aviation bathymetry LiDAR apparatus 10 of the present disclosure may emit the combine laser beam Lc into the sea and the land while moving in a horizontal direction above the sea and the land. Specifically, the aviation bathymetry LiDAR apparatus 10 of the present disclosure may emit the combine laser beam Lc refracted at the first angle through the prism 143 toward the sea and the land in a rotating state.

As shown in FIG. 4, when the aircraft AP is viewed from a plan view, the combine laser beam Lc, which is emitted from the aviation bathymetry LiDAR apparatus 10 and reaches the sea and the land, may have a ring shape. In addition, as the aviation bathymetry LiDAR apparatus 10 moves in the horizontal direction, the combine laser beams Lc may overlap each other.

In other words, the combine laser beams Lc may overlap each other to form a bathymetric surface. The bathymetric surface may have a first width. The first width a may be a length of a side extending in a direction perpendicular to the moving direction of the aircraft AP among sides defining the bathymetric surface. In an exemplary embodiment, the first width a may be about 280 meters to about 300 meters. For example, the first width a may be about 291 meters.

The combine laser beam Lc emitted from the aviation bathymetry LiDAR apparatus 10 may form the above-described bathymetric surface, and the aviation bathymetry LiDAR apparatus 10 may obtain topographic information of the sea and topographic information of the land by using the bathymetric surface. Accordingly, the range of bathymetry of the aviation bathymetry LiDAR apparatus 10 may be widened, and the time for bathymetry may be reduced. That is, the bathymetric efficiency using the aviation bathymetry LiDAR apparatus 10 may be improved.

The first laser beam L1 of the combine laser beam Lc may not pass through the sea and may be reflected from the surface of the sea and the surface of the land. A portion of the first laser beam L1 of the return laser beam Lr reflected from the surface of the sea and the surface of the land may reach the holographic optical element 145 of the aviation bathymetry LiDAR apparatus 10.

In addition, the detector 160 of the aviation bathymetry LiDAR apparatus 10 according to the present disclosure may acquire topographic information on the surface of the sea and topographic information on the surface of the land through the first laser beam L1.

A second laser beam L2 of the combine laser beam Lc may pass through the sea and be reflected from the bottom of the sea. A portion of the second laser beam L2 of the return laser beam Lr reflected from the bottom of the sea may reach the holographic optical element 145 of the aviation bathymetry LiDAR apparatus 10.

In addition, the detector 160 of the aviation bathymetry LiDAR apparatus 10 according to the present disclosure may obtain the topographic information on the bottom surface of the sea through the second laser beam L2.

The aviation bathymetry LiDAR apparatus 10 of the present disclosure may emit the combine laser beam Lc, which coupled the first laser beam L1 and the second laser beam L2, and acquire topographic information of the sea and the land at a time based on the return laser beam Lr reflected from the surface of the sea, the bottom surface of the sea, and the surface of the land.

Accordingly, the method of performing bathymetry using the aviation bathymetry LiDAR apparatus 10 of the present disclosure may omit the steps of acquiring topographic information of the sea and topographic information of the land, respectively, and integrating the topographic information into one.

Figure 5:
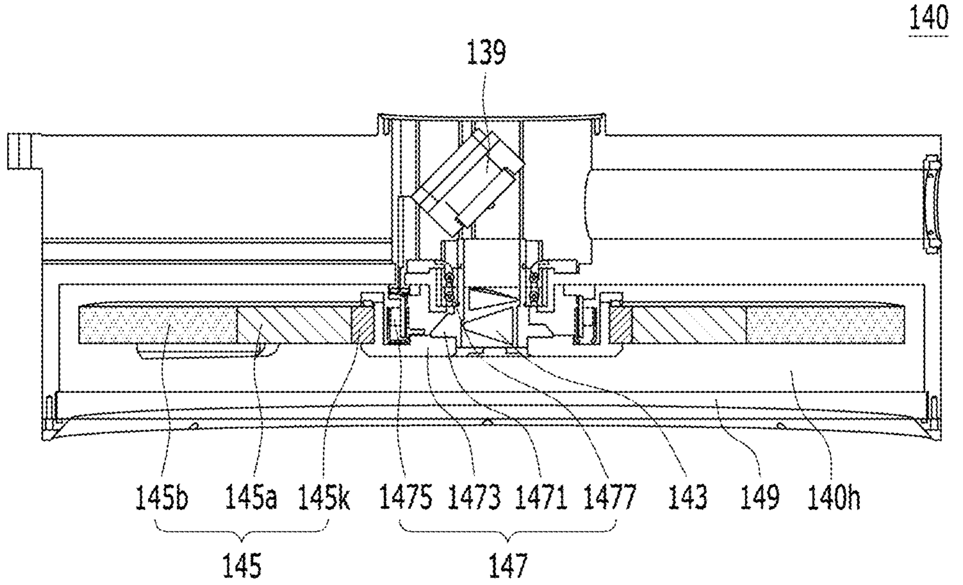
FIG. 5 is a cross-sectional view of a scanner according to an exemplary embodiment of the present disclosure.

FIG. 5 is a cross-sectional view of the scanner 140 according to an example embodiment. In addition, FIG. 6 is a plan view of a holographic optical element 145 according to an exemplary embodiment.

Referring to FIG. 5, the scanner 140 may include a scanner housing 140*h*, a prism 143, a holographic optical element 145, and a scanner motor 147. In addition, the holographic optical element 145 may include a coupling region 145*k*, a first optical region 145*a*, and a second optical region 145*b*. In addition, the scanner motor 147 may include a shaft 1471, a clamp 1473, a rotor 1475, a bearing 1477, and the like.

In an exemplary embodiment, the prism 143 may be disposed under the transfer mirror 139. For example, the prism 143 may be disposed under the transfer mirror 139 to overlap the transfer mirror 139 in the first direction. In addition, the first direction may be a direction parallel to a direction in which the first axis extends, and may be a direction parallel to a direction of gravity.

In addition, the prism 143 may be disposed in an inner space of the shaft 1471 of the scanner motor 147 and may be coupled to the inside of the shaft 1471. Accordingly, as the shaft 1471 rotates about the first axis extending in the first direction, the prism 143 may also rotate about the first axis.

The holographic optical element 145 may be provided in a ring shape having a coupling hole in a central portion. In an exemplary embodiment, the holographic optical element 145 may include a coupling region 145*k* coupled to the clamp 1473 of the scanner motor 147, a first optical region 145*a* surrounding the coupling region 145*k*, and a second optical region 145*b* surrounding the first optical region 145*a*.

The shaft 1471 of the scanner motor 147 may be a shaft extending in the first direction. Further, the shaft 1471 may be configured to rotate about a first axis extending in the first direction. For example, the shaft 1471 may rotate about the first axis by the operation of the rotor 1475. In addition, the shaft 1471 may accommodate the prism 143 therein.

The clamp 1473 of the scanner motor 147 may be configured to extend outwardly from a lower portion of the shaft 1471 to fix the holographic optical element 145. In detail, the clamp 1473 may be accommodated in the coupling hole 145*h* of the holographic optical element 145 and may be coupled to the coupling portion 145*k* of the holographic optical element 145. Accordingly, the holographic optical element 145 may rotate together with the shaft 1471. In addition, the holographic optical element 145 may surround the prism 143 disposed in the shaft 1471.

The rotor 1475 of the scanner motor 147 may be configured to transfer rotational force to the shaft 1471. Specifically, the rotor 1475 may be configured to generate a rotating magnetic field through an alternating current voltage to rotate the shaft 1471.

In an exemplary embodiment, the rotor 1475 may include an electromagnet. In addition, a stator may be disposed outside the rotor 1475. When power is applied to the conducting wire provided to the stator, a rotating magnetic field may be formed. The rotor 1475 may obtain a rotational force by the rotating magnetic field, and may transfer the rotational force to the shaft 1471.

The bearing 1477 of the scanner motor 147 may be disposed outside the shaft 1471. The bearing 1477 may be configured to fix the shaft 1471 to a specific position and guide rotation of the shaft 1471. In an exemplary embodiment, the bearing 1477 may include a ball bearing. However, the type of the bearing 1477 is not limited to the above-described type.

In an exemplary embodiment, when the scanner 140 is viewed from a plan view, the footprint of the holographic optical element 145 may be larger than the footprint of the prism 143. In other words, when the scanner 140 is viewed from a plan view, the area of the holographic optical element 145 may be larger than the area of the prism 143.

In a method of obtaining terrain information of a sea and terrain information of a land by using the aviation bathymetry LiDAR apparatus 10 of the present disclosure, it may be important to improve a reception amount of a return laser beam reflected from the sea and the land. In addition, the laser beam that is refracted at the first angle through the prism 143 and is emitted to the sea and the land tends to be reflected from the sea and the land and return to an adjacent region of the prism 143. Accordingly, in order to improve the reception amount of the return laser beam reflected from the sea and the land, the holographic optical element 145 needs to be disposed in a region adjacent to the prism 145 and have a relatively large footprint.

The holographic optical element 145 of the present invention may be provided in a ring shape surrounding the prism 143. Accordingly, the holographic optical element 145 and the prism 143 may be disposed at substantially the same level. Also, the footprint of the holographic optical element 145 may be larger than the footprint of the prism 143.

The transfer mirror 139 and the prism 143 may be disposed to vertically overlap the coupling hole 145*h* of the holographic optical element 145. Accordingly, an obstacle may not be formed in the movement path of the combine laser beam that has passed through the transfer mirror 139 and the prism 143.

In addition, the level of the holographic optical element 145 may be substantially the same as the level of the prism 143, and the holographic optical element 145 may be disposed to surround the prism 143. Accordingly, the volume of the scanner 140 including the prism 143 and the holographic optical element 145 according to the present disclosure may be reduced, and the scanner 140 may be easily replaced and transported. In addition, the holographic optical element 145 may replace a combination of a mirror, a lens, and the like, which are used in the related art, so that the weight of the scanner 140 according to the present disclosure may be reduced.

Figure 6:
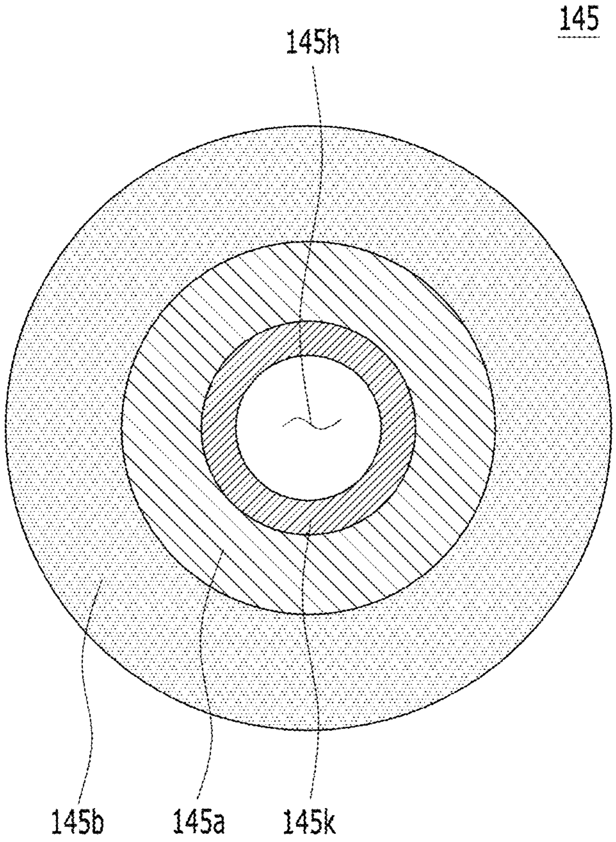
FIG. 6 is a plan view of a holographic optical element according to an exemplary embodiment of the present disclosure.

Referring to FIG. 6, the holographic optical element 145 may include a coupling region 145*k*, a first optical region 145*a*, and a second optical region 145*b*.

The holographic optical element 145 may be provided in a ring shape. For example, the holographic optical element 145 may be provided in a disk shape having a circular coupling hole 145*h* at a central portion thereof.

The coupling region 145*k* may have a coupling hole 145*h* for receiving at least a portion of the scanner motor 147. In detail, the coupling hole 145*h* of the coupling region 145*k* may accommodate a portion of the clamp 1473 of the scanner motor 147, and the coupling region 145*k* may be coupled to an inner portion of the clamp 1473. For example, the clamp 1473 may be configured to clamp the upper and lower portions of the coupling region 145*k* of the holographic optical element 145 with a fastener.

In addition, the first optical region 145*a* may be provided in a ring shape surrounding the coupling region 145*k*. In an exemplary embodiment, the first optical region 145*a* may pass the first laser beam L1 having the first wavelength of the return laser beam Lr. In addition, the first optical region 145*a* may refract the first laser beam L1 at a first angle with respect to the first axis such that the traveling direction of the first laser beam L1 is parallel to the extending direction of the first axis.

In an exemplary embodiment, the first optical region 145*a* may have a first optical pattern on a surface thereof. The first optical pattern may be an optical pattern configured to pass a first laser beam L1 having a first wavelength. The first optical pattern may be an optical pattern configured to block a laser beam having a wavelength different from the first wavelength.

However, the present invention is not limited thereto, and the first optical region 145*a* may have the first roughness on the surface thereof. The first roughness may be a roughness configured to pass the first laser beam L1 having a first wavelength.

In an exemplary embodiment, the first laser beam L1 of the return laser beam Lr reflected from the target may be less diffused than the second laser beam L2 of the return laser beam Lr. Accordingly, the first optical region 145*a* through which the first laser beam L1 passes may be provided inside the second optical region 145*b*. In addition, the region of the first optical region 145*a* may be smaller than the region of the second optical region 145*b*. In other words, the footprint of the first optical region 145*a* may be smaller than the footprint of the second optical region 145*b*.

In addition, the second optical region 145*b* may be provided in a ring shape surrounding the first optical region 145*a*. In an exemplary embodiment, the second optical region 145*b* may pass the second laser beam L2 having the second wavelength of the return laser beam Lr. In addition, the second optical region 145*b* may refract the second laser beam L2 at a first angle with respect to the first axis such that the traveling direction of the second laser beam L2 is parallel to the extending direction of the first axis.

In an exemplary embodiment, the second optical region 145*b* may have a second optical pattern different from the first optical pattern on the surface. The second optical pattern may be an optical pattern configured to pass a second laser beam L2 having a second wavelength. The second optical pattern may be an optical pattern configured to block a laser beam having a wavelength different from the second wavelength.

However, the present invention is not limited thereto, and the second optical area 145*b* may have the second roughness on the surface thereof. The second roughness may be a roughness configured to pass a second laser beam L2 having a second wavelength.

In an exemplary embodiment, the second laser beam L2 of the return laser beam Lr may be more diffused than the first laser beam L1 of the return laser beam Lr. Accordingly, the second optical region 145*b* through which the second laser beam L2 passes may be provided outside the first optical region 145*a*. In addition, the region of the second optical region 145*b* may be larger than the region of the first optical region 145*a*. In other words, the footprint of the second optical region 145*b* may be larger than the footprint of the first optical region 145*a*.

In an exemplary embodiment, the first optical region 145*a* and the second optical region 145*b* may be provided in a ring shape, and thus the first optical region 145*a* and the second optical region 145*b* may maintain the ring shape while the holographic optical element 145 rotates about the first axis.

That is, while the holographic optical element 145 rotates about the first axis, the shapes of the first optical region 145*a* and the second optical region 145*b* may be maintained in a ring shape, and thus transmission and refraction of the return laser beam by the first optical region 145*a* and the second optical region 145*b* may be efficiently performed.

Figure 7:
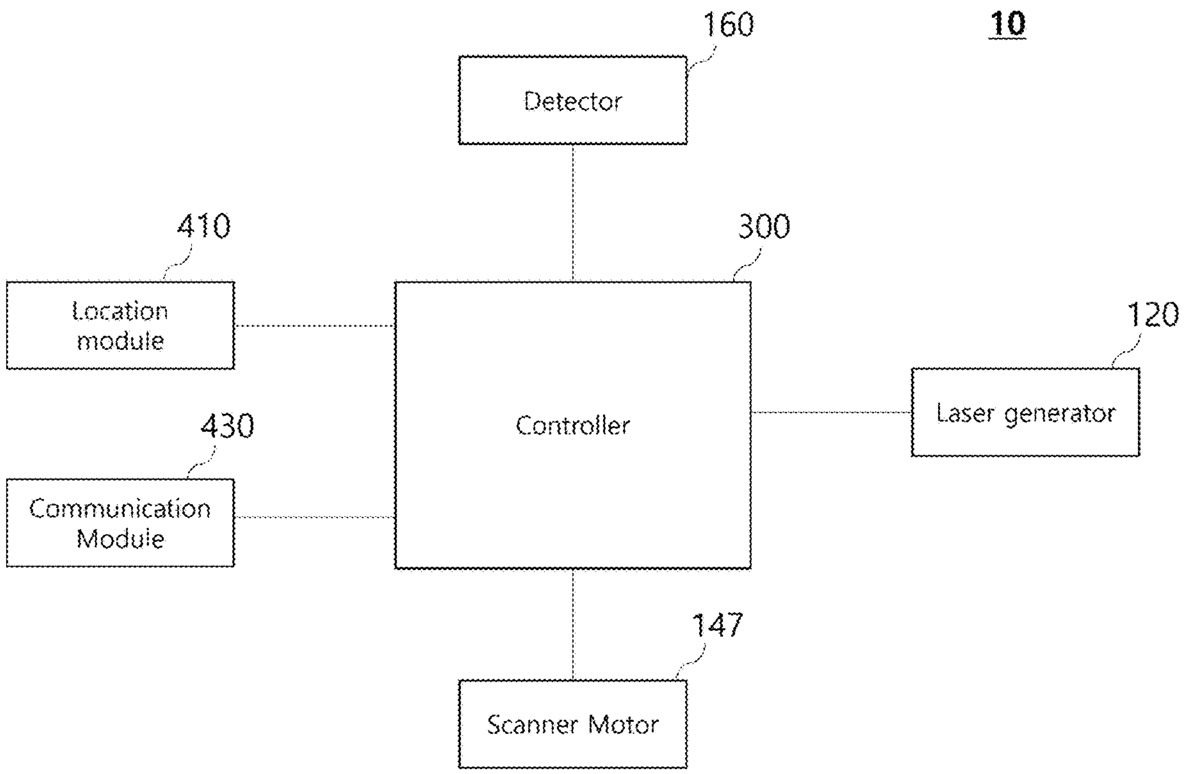
FIG. 7 is a block diagram of an aviation bathymetry LiDAR apparatus according to an exemplary embodiment of the present disclosure.

FIG. 7 is a block diagram of the aviation bathymetry LiDAR apparatus 10 according to an exemplary embodiment of the present invention.

Referring to FIG. 7, the aviation bathymetry LiDAR apparatus 10 of the present disclosure may further include a controller 300, a position module 410, and a communication module 430.

The controller 300 may be implemented in hardware, firmware, software, or any combination thereof. For example, the controller 300 may be a computing device such as a workstation computer, a desktop computer, a laptop computer, a tablet computer, or the like. The controller 300 may be a simple controller, a microprocessor, a processor configured by software, a processor configured by a complex processor such as a CPU, a GPU, or the like, dedicated hardware or firmware.

In an exemplary embodiment, the operations of the controller 300 may be implemented as instructions stored on a machine-readable medium that may be read and executed by one or more processors. Here, the machine-readable medium may include any mechanism for storing and/or transmitting information in a form readable by a machine (e.g., a computing device). For example, the machine-readable medium may include a Read Only Memory (ROM), a Random Access Memory (RAM), a magnetic disk storage medium, an optical storage medium, flash memory devices, electric, optical, acoustic, or other types of radio signals (e.g., carrier waves, infrared signals, digital signals, etc.), and other arbitrary signals.

The controller 300 may be implemented by firmware, software, routines, and instructions for performing a step of obtaining topographic information of the sea and the land using the aviation bathymetry LiDAR apparatus 10. For example, the controller 300 may be implemented by software that receives data for feedback, generates a signal for operating the aviation bathymetry LiDAR apparatus 10, and performs a predetermined operation.

In an exemplary embodiment, the controller 300 may be the LRU 170 described above. However, the present invention is not limited thereto, and the controller 300 may be provided as separate hardware to control a plurality of components of the aviation bathymetry LiDAR apparatus 10.

In an exemplary embodiment, the controller 300 may be connected to the laser generator 120 and the detector 160. For example, the controller 300 may control the wavelengths of the first laser beam L1 and the second laser beam L2 emitted by the laser generator 120.

In an exemplary embodiment, the controller 300 may couple or debug the light amount, the image of the wavelength, the speed, and the like of the first laser beam L1 and the second laser beam L2 together with the position information.

The location module 410 receives data about the current location of the aviation bathymetry LiDAR apparatus 10 and generates location information. In addition, the communication module 430 is a module that performs communication with an external device, and uses a mobile communication network or an Internet network.

When the communication module 430 uses a wireless communication network, the wireless communication network may include a Local Area Network (LAN), a Wide Area Network (WAN), the World Wide Web (WWW), a wired/wireless data communication network, a telephone network, a wired/wireless television communication network, 3G, 4G, 5G, 3rd Generation Partnership Project (3GPP), 5th Generation Partnership Project (5GPP), Long Term Evolution (LTE), World Interoperability for Microwave Access (WIMAX), Wi-Fi, the Internet, a Local Area Network (LAN), a Wireless Local Area Network (Wireless LAN), a Wide Area Network (WAN), a Personal Area Network (PAN), Radio Frequency (RF), a Bluetooth network, a Near Field Communication (NFC) network, a satellite broadcasting network, a Digital Multimedia Broadcasting (DMB) network, and the like.

Exemplary embodiments have been disclosed in the drawings and in the specification as described above. Although embodiments have been described using specific terms in the present specification, they are used only for the purpose of describing the technical spirit of the present disclosure and are not used to limit the scope of the present disclosure described in the meaning limitation or Claims. Therefore, it will be understood by those of ordinary skill in the art that various modifications and other equivalent embodiments are possible therefrom. Therefore, the true technical protection scope of the present disclosure should be determined by the technical idea of the appended claims.

What is claimed is:

1. An aviation bathymetry LiDAR apparatus comprising:

a first laser generator configured to generate a first laser beam;

a second laser generator configured to generate a second laser beam having a wavelength different from that of the first laser beam;

an optical manifold configured to receive and couple the first laser beam and the second laser beam to generate a combine laser beam;

a transfer mirror configured to reflect the combine laser beam received from the optical manifold in a direction parallel to a first axis;

a scanner motor comprising:

a shaft configured to rotate about the first axis and to accommodate a prism in an internal space thereof, and a clamp extending outward from the shaft;

the prism being accommodated in the internal space of the shaft, being configured to refract the combine laser beam at a first angle based on the first axis to emit the combine laser beam to a target, and rotating about the first axis together with the shaft;

a holographic optical element fixed to the clamp, surrounding the prism, being configured to refract a return laser beam reflected from the target to emit the return laser beam to be parallel to the first axis, and rotating about the first axis together with the prism;

a telescope configured to condense the return laser beam received from the holographic optical element to generate a return combine laser beam, and to emit the return combine laser beam in a direction parallel to the first axis; and a detector configured to measure a distance to the target using at least one of a light amount, an image of a wavelength, a speed, and an arrival time of the first laser beam and the second laser beam included in the return combine laser beam received from the telescope.

2. The aviation bathymetry LiDAR apparatus of claim 1, wherein a wavelength of the first laser beam is 1030 nm to 1100 nm, and a wavelength of the second laser beam is 490 nm to 570 nm.

3. The aviation bathymetry LiDAR apparatus of claim 1, wherein the first angle is in a range of 15 degrees to 25 degrees.

4. The aviation bathymetry LiDAR apparatus of claim 1, wherein the holographic optical element comprises:

a coupling region having a coupling hole coupled to the scanner motor;

a first optical region provided in a ring shape to surround the coupling region and having a first optical pattern on a surface thereof to pass the first laser beam of the return laser beam; and a second optical region provided in a ring shape to surround the first optical region and having a second optical pattern on a surface thereof to pass the second laser beam of the return laser beam.

5. The aviation bathymetry LiDAR apparatus of claim 4, wherein the transfer mirror and the prism are disposed to overlap the coupling hole of the holographic optical element in a first direction in which the first axis extends.

6. The aviation bathymetry LiDAR apparatus of claim 1, wherein a footprint of the holographic optical element is larger than a footprint of the prism.

7. The aviation bathymetry LiDAR apparatus of claim 1, wherein the combine laser beam reflected by the transfer mirror is coaxial with the return combine laser beam emitted by the telescope.

8. The aviation bathymetry LiDAR apparatus of claim 1, wherein the detector comprises:

a photomultiplier tube configured to detect a wavelength corresponding to the second laser beam; and an avalanche photodetector configured to detect a wavelength corresponding to the first laser beam.

9. The aviation bathymetry LiDAR apparatus of claim 8, wherein the detector further comprises:

a splitter configured to distribute the second laser beam of the return combine laser beam received from the telescope to the photomultiplier; and a reflecting mirror configured to reflect the first laser beam received from the splitter to the avalanche photodetector.

* * * * *